(12) United States Patent
Venkatesh et al.

(10) Patent No.: US 12,395,138 B2
(45) Date of Patent: Aug. 19, 2025

(54) CURRENT STEERING BIASING FOR POWER CONTROL IN CASCODE-BASED POWER AMPLIFIER STAGE OF RADAR APPLICATIONS FOR IMPROVED RELIABILITY

(71) Applicant: NXP B.V., Eindhoven (NL)

(72) Inventors: Achal Venkatesh, Bangalore (IN); Gilles Montoriol, Fontenilles (FR); Birama Goumballa, Larra (FR)

(73) Assignee: NXP B.V., Eindhoven (NL)

( * ) Notice: Subject to any disclaimer, the term of this patent is extended or adjusted under 35 U.S.C. 154(b) by 591 days.

(21) Appl. No.: 17/812,292

(22) Filed: Jul. 13, 2022

(65) Prior Publication Data

US 2023/0412131 A1 Dec. 21, 2023

(30) Foreign Application Priority Data

May 25, 2022 (IN) .............................. 202221030004

(51) Int. Cl.
| | |
|---|---|
| *H03F 3/24* | (2006.01) |
| *G01S 7/02* | (2006.01) |
| *H03F 3/195* | (2006.01) |
| *H03F 3/45* | (2006.01) |
| *H03F 3/72* | (2006.01) |

(52) U.S. Cl.
CPC ................ *H03F 3/245* (2013.01); *G01S 7/02* (2013.01); *H03F 3/195* (2013.01);
(Continued)

(58) Field of Classification Search
CPC .............. H03F 3/245; H03F 2200/451; H03F 2203/7221; H03F 2203/7239; H03F 3/72;
(Continued)

(56) References Cited

U.S. PATENT DOCUMENTS 8,514,015 B2 * 8/2013 Chen ....................... H03F 1/223
330/311
8,928,415 B2 1/2015 Cha et al.
(Continued)

FOREIGN PATENT DOCUMENTS

| CN | 110554389 A | * | 12/2019 | ........... G01S 13/931 |
| FR | 2970388 A1 | * | 7/2012 | ............. H03F 1/223 |

(Continued)

OTHER PUBLICATIONS

Freitas et al., Stochastic Thermodynamics of Non-Linear Electronic Circuits: A Realistic Framework for Computing around kT, 2020, ResearchGate (Year: 2020).*

(Continued)

*Primary Examiner* — Andrea Lindgren Baltzell
*Assistant Examiner* — Lance Torbjorn Bartol

(57) ABSTRACT

A power amplifier stage including multiple amplifier branch circuits, in which each amplifier branch circuit includes a cascode device, a source device, and a replica cascode device. The cascode device has current terminals coupled between an output node and an intermediate node, and has a control terminal receiving a corresponding activation signal. The source device has current terminals coupled between a supply reference node and the intermediate node, and has a control terminal receiving an input signal. The replica cascode device has current terminals coupled between a supply node and the intermediate node, and has a control terminal receiving a corresponding complementary activation signals. An output power level of the power amplifier stage is controlled by asserting a selected number of activation signals and corresponding complementary activation signals for activating a selected number of the amplifier branch circuits.

20 Claims, 3 Drawing Sheets

(52) U.S. Cl.
CPC .......... *H03F 3/45201* (2013.01); *H03F 3/72* (2013.01); *H03F 2200/451* (2013.01); *H03F 2203/7239* (2013.01)

(58) Field of Classification Search
CPC ............. H03F 3/45201; H03F 3/45021; H03F 2200/72; H03F 2200/75; H03F 3/195; G01S 7/02; H03G 3/001
USPC ......................................................... 330/291
See application file for complete search history.

(56) References Cited

U.S. PATENT DOCUMENTS

| | | | |
|---|---|---|---|
| 2011/0037518 A1* | 2/2011 | Lee | .......................... H03F 3/211 330/253 |
| 2015/0270806 A1 | 9/2015 | Wagh et al. | |
| 2020/0144978 A1* | 5/2020 | Park | .......................... H03F 1/56 |

FOREIGN PATENT DOCUMENTS

| | | | |
|---|---|---|---|
| JP | 6071849 | B2 | 2/2017 |
| JP | 6345760 | B2 | 6/2018 |
| KR | 2014033186 | A * | 3/2014 |
| WO | 2018164751 | A1 | 9/2018 |

OTHER PUBLICATIONS

Koutani et al., "A Digitally Controlled Variable-gain Low-noise Amplifier with Strong Immunity to Interferers", IEEE Asian Solid-State Circuits Conference, Nov. 1, 2006, pp. 71-74.

* cited by examiner

CURRENT STEERING BIASING FOR POWER CONTROL IN CASCODE-BASED POWER AMPLIFIER STAGE OF RADAR APPLICATIONS FOR IMPROVED RELIABILITY

CROSS-REFERENCE TO RELATED APPLICATIONS

This application claims priority under 35 U.S.C. § 119 of India patent application No. 202221030004, filed on 25 May 2022, the contents of which are incorporated by reference herein.

BACKGROUND

Field of the Invention

The present disclosure relates in general to output power control for radar transmitters, and more specifically to a current steering biasing method to achieve fast coarse power control in cascode-based power amplifier stages of radar applications.

Description of the Related Art

Radar systems may be used in a variety of applications. One such application is automobiles, including, for example, self-driving cars and advanced driver assistant systems (ADASs). Automotive radar systems, along with other sensors (e.g., cameras and the like), are used to improve safety and reliability, such as including the detection of objects and obstacles, their position, and their speed relative to the local vehicle. In order to facilitate a variety of functions and operations, the radar transmitter should operate at multiple power levels and be able to switch between different power levels with sufficient speed to achieve the desired objectives. A cascode-based amplifier incorporating a stacked cascode device is particularly beneficial in that it may be switched on and off very quickly. Cascode-based amplifiers may be configured into multiple amplifier stage branches that are coupled together in parallel to provide a combined output signal. In this manner, a selected number of the parallel branches may be activated or deactivated to control the output power of the radar system. In certain fabrication technologies, however, each disabled cascode device may be exposed to excessive voltage levels that significantly reduce reliability.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

A power amplifier stage implemented with amplifier branch circuits as described herein provides reliable output power switching flexibility of a transmitter chain of a radar system. Multiple amplifier branch circuits are coupled in parallel in each of one or more power amplifier stages in a transmitter chain to provide a single combined output power signal. Each amplifier branch circuit includes a cascode device that can be switched on or off very quickly to enable fast output power switching. The replica cascode device is provided in parallel with the cascode device and controlled by a complementary activation signal that is inverted relative to the activation signal controlling the cascode device. The replica cascode device provides an alternative current path when the amplifier branch is deactivated so that the cascode device is not exposed to excessive voltage levels. The replica cascode device ensures that current is steered away from the main cascode path when deactivated so that there is no power gain from input to output. Since current is simply switched from one path to another in each amplifier branch, overall current and current change from the power amplifier supply is minimized.

Figure 1:
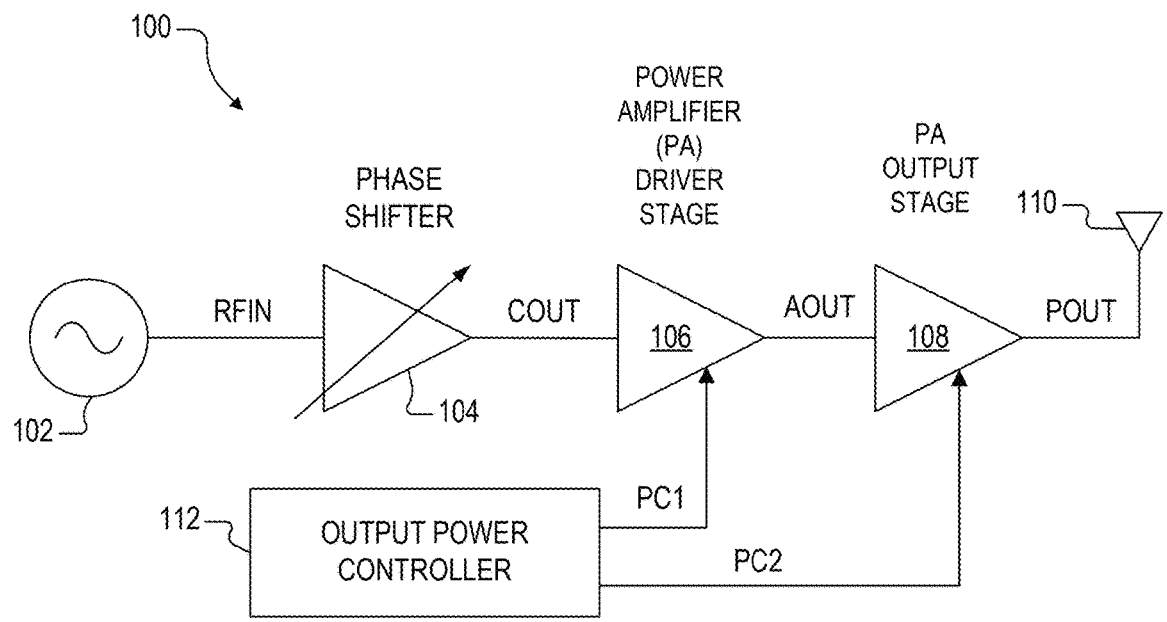
FIG. 1 is a simplified schematic and block diagram of a transmitter chain of a radar transceiver of a radar system, in which the transmitter chain includes power amplifier stages that are implemented according to one embodiment of the present disclosure.

FIG. 1 is a simplified schematic and block diagram of a transmitter chain 100 of a radar transceiver of a radar system, in which the transmitter chain 100 includes power amplifier stages that are implemented according to one embodiment of the present disclosure. A signal generator 102 generates a radio frequency (RF) input signal RFIN, which is provided to an input of a variable phase shifter 104. The phase shifter 104 receives RFIN and provides a signal COUT to an input of a power amplifier (PA) driver stage 106, which is used to develop an amplified signal AOUT. The AOUT signal is provided to an input of a PA output stage 108, having an output providing an output power signal POUT which is used to develop an output RF signal provided to an antenna 110 for transmission. The PA driver stage 106 and the PA output stage are both power amplifier stages provided in the transmitter chain 100.

The signal generator 102 may be configured as a frequency modulated continuous wave (FMCW) generator that modulates the frequency of RFIN over time, such as linearly using a sawtooth waveform or the like. The FMCW generator may be configured as a phase-locked loop circuit having a reference input clock at a selected frequency level, in which the FMCW generator sweeps the frequency over time at frequencies and rates depending upon the particular radar application being employed. The phase shifter 104 is adjustable to provide electronic beam steering capability, which is a feature of multiple input, multiple output (MIMO) radar systems. The phase shifter 104 ensures that the antenna beam can be electronically steered to achieve higher angular resolution to more accurately determine a position of an external object. In one embodiment, the phase shifter 104 outputs COUT as a differential signal with separate polarities that are 180 degrees out of phase with respect to each other.

As described further herein, the PA driver stage 106 and the PA output stage 108 are each cascode-based amplifiers having a parallel configuration with multiple amplifier branch circuits coupled in parallel. A parallel configuration provides the flexibility to reduce the power of each power amplifier stage very quickly. This flexibility ensures that operation mode of a single radar chip can be interleaved dynamically with respect to time. Additionally, from an application point of view, this feature minimizes the need for separate radar chips for different modes of operation. In particular, a parallel configuration enables individual branches to be switched on or off to coarsely control the power level of POUT at the output. An output power controller 112 provides a first set of activation signals PC1 to the PA driver stage 106 and provides a second set of activation signals PC2 to the PA output stage 108 to roughly control the power level of the output signal between low, intermediate, and high power levels. Although not shown or described, other power control circuitry may be provided to more finely tune output power level. As described further herein, each set of activation signals PC1 and PC2 includes multiple pairs of activation signals for activating a corresponding pair of cascode-based amplifiers for each of the 0 and 180 degree phases within a corresponding one of the PA amplifier stages 106 and 108.

Figure 2:
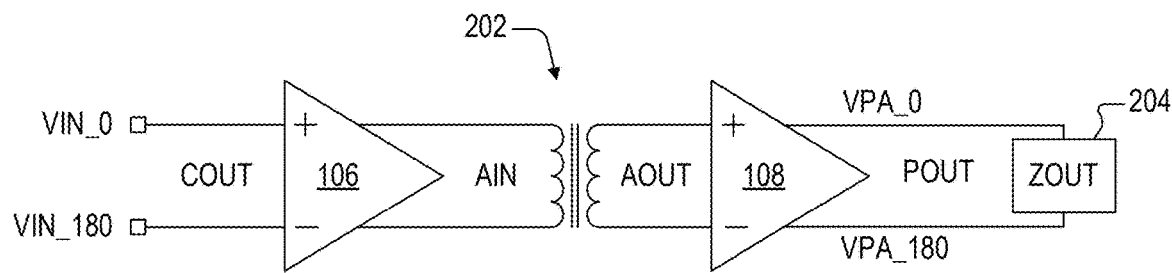
FIG. 2 is a more detailed schematic diagram of the power amplifier stages of the transmitter chain of FIG. 1 according to one embodiment of the present disclosure.

FIG. 2 is a more detailed schematic diagram of the power amplifier stages of the transmitter chain 100 according to one embodiment of the present disclosure. COUT is shown as a differential signal including a first polarity VIN_0 and a second polarity VIN_180 that are 180 degrees out of phase with respect to each other, in which VIN_0 is provided to a positive (or non-inverting) input and VIN_180 is provided to a negative (or inverting) input of the PA driver stage 106. The PA driver stage 106 has differential outputs providing individual polarities of a differential signal AIN across opposite terminals of a primary winding of a transformer 202. The transformer 202 has a secondary winding with opposite terminals providing AOUT as a differential signal coupled across the positive and negative inputs of the PA output stage 108. The PA output stage 108 has a differential output providing POUT as a differential signal with VPA_0 and VPA_180 polarities to respective inputs of an impedance matching circuit (ZOUT) 204. Although not specifically shown, the impedance matching circuit (ZOUT) 204 generates an output RF signal for transmission by the antenna 110.

Figure 3:
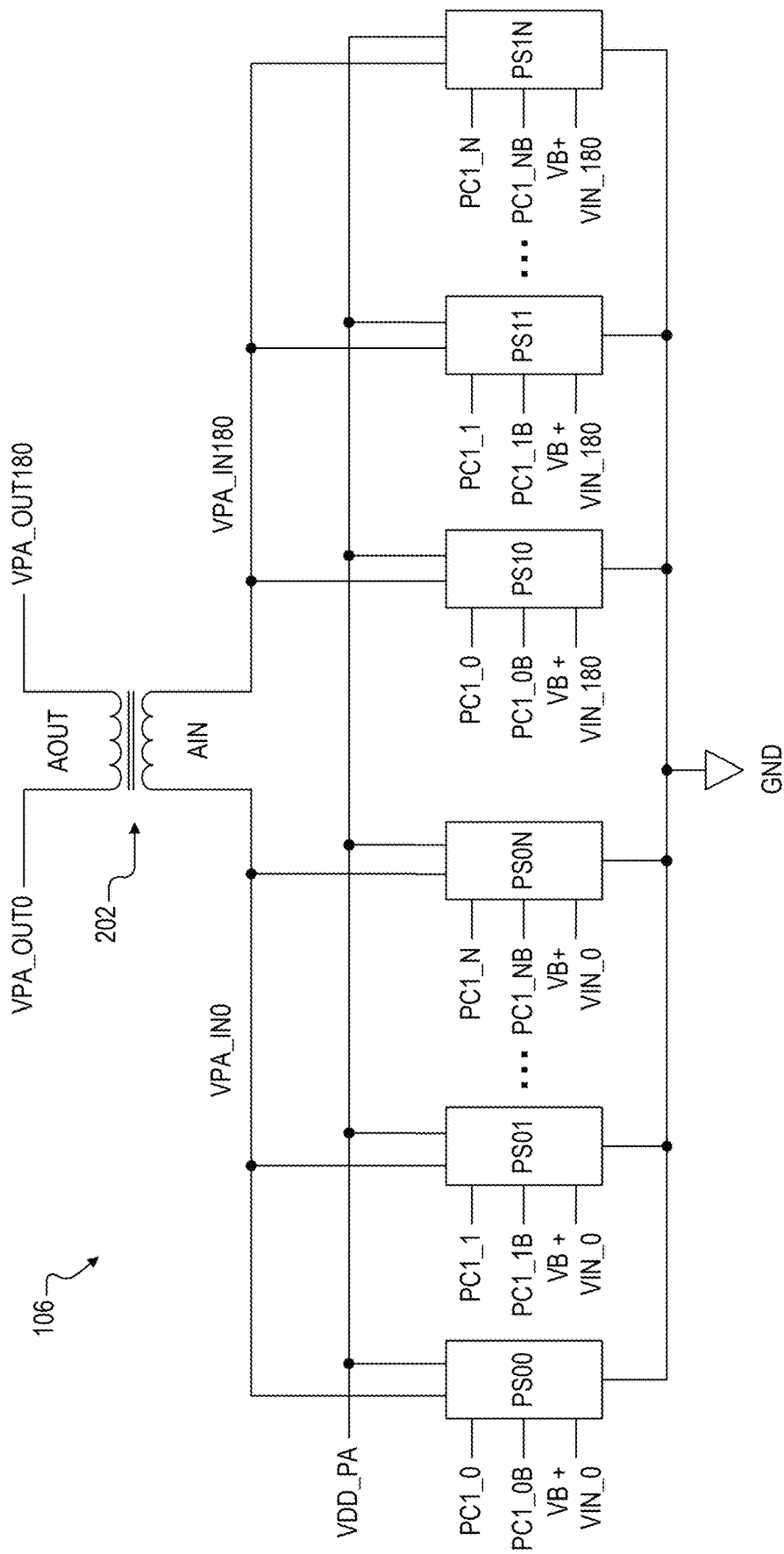
FIG. 3 is a more detailed block diagram of the PA driver of FIG. 1 according to one embodiment of the present disclosure.

FIG. 3 is a more detailed block diagram of the PA driver stage 106 according to one embodiment of the present disclosure. The PA driver stage 106 includes a first set of N+1 individual amplifier branch circuits PS00, PS01, . . . , PS0N (PS00-PS0N) for phase 0 and a second set of N+1 individual amplifier branch circuits PS10, PS11, . . . , PS1N (PS10-PS1N) for phase 180 in which each phase has an equal number of amplifier branch circuits. The integer "N" is greater than 0 having a value based on the desired power level granularity for the particular configuration of the PA driver stage 106. Each of the amplifier branch circuits PS00-PS0N for phase 0 are coupled between a supply reference node, such as ground (GND) and a 0-degree phase voltage polarity signal VPA_IN0. Similarly, each of the amplifier branch circuits PS10-PS1N for phase 180 are coupled between GND and a 180-degree phase voltage polarity signal VPA_IN180. VPA_IN0 and VPA_IN180 are shown as the separate polarities of AIN coupled to opposite terminals of the primary winding of the transformer 202, in which the secondary winding generates the differential AOUT signal having polarity voltage signals VPA_OUT0 and VPA_OUT180. A power supply voltage VDD_PA for the power amplifier is provided to each of the amplifier branch circuits PS00-PS0N and PS10-PS1N.

A bias voltage VB is added to the first polarity VIN_0 of COUT and the sum VB+VIN_0 is provided to an input of each of the amplifier branch circuits PS00-PS0N. Likewise, VB is added to the second polarity VIN_180 of COUT and the sum VB+VIN_180 is provided to an input of each of the amplifier branch circuits PS10-PS1N. The set of activation signals PC1 includes a first set of N+1 activation signals PC1_0, PC1_1, . . . , PC1_N (PC1_0-PC1_N), and a complementary set of N+1 activation signals PC1_0B, PC1_1B, . . . , PC1_NB (PC1_0B-PC1_NB), in which "B" denotes negation such that the PC1_0B-PC1_NB signals are negated versions of the PC1_0-PC1_N signals. Thus, for example, PC1_0B is a complementary (or negated) version of PC1_0, PC1_1B is a complementary (or negated) version of PC1_1, and so on. Each of the PC1_0-PC1_N signals is provided to an input of a respective one of the amplifier branch circuits PS00-PS0N and also to a corresponding one of the amplifier branch circuits PS10-PS1N. Likewise, each of the PC1_0B-PC1_NB signals is provided to an input of a respective one of the amplifier branch circuits PS00-PS0N and also to a corresponding one of the amplifier branch circuits PS10-PS1N.

Each of the PC1 signals has a high voltage level that is sufficient to fully turn on a cascade transistor to fully activate a corresponding amplifier branch, and has a low voltage level to fully turn off the cascade transistor to deactivate the corresponding amplifier branch. In this manner, when PC1 activates (or deactivates) one or more of the amplifier branch circuits PS00-PS0N of phase 0, it also activates (or deactivates) the corresponding one or more of the complementary amplifier branch circuits PS10-PS1N. Thus, for example, when PC1_0 is asserted high (while PC1_0B is asserted low), both complementary amplifier branch circuits PS00 and PS10 are activated. Similarly, when PC1_0 is asserted low (while PC1_0B is asserted high), both complementary amplifier branch circuits PS00 and PS10 are deactivated. The number of the PC1_X signals that are asserted high determines the number of activated amplifier branch circuit pairs that correspondingly determines the power amplification level of the PA driver stage 106, in which "X" denotes an index from 0 to N+1.

Although not specifically shown, the PA output stage 108 may have a substantially identical configuration as the PA driver stage 106 for converting AOUT to POUT. In one embodiment, PA output stage 108 has the same (e.g., N+1) number of amplifier branch circuits for each phase 0 and 180. In an alternative embodiment, PA output stage 108 may have a different number of amplifier branch circuits depending upon the particular configuration. For the PA output stage 108, a bias voltage VBx, which may be the same bias voltage VB or a different bias voltage, is added to VPA_OUT0 and provided to an input of each of the phase 0 amplifier branch circuits (i.e., VBx+VPA_OUT0 rather than VB+VIN_0), and that same bias voltage VBx is added to VPA_OUT180 and provided to an input of each of the phase 180 amplifier branch circuits (i.e., VBx+VPA_OUT180 rather than VB+VIN_180). Each of the amplifier branch circuits may also be coupled to VDD_PA. Also, each of the PC1 activation signals is replaced by a corresponding PC2 activation signal, i.e., PC2_0, PC2_1, . . . PC2_M and PC2_0B, PC2_1B, . . . PC2_MB), in which "M" is also an integer greater than zero having a value based on the desired power level granularity for the particular configuration of the PA output stage 108. M and N may be the same or may be different for different embodiments. Again, each of the PC2 activation signals has a high voltage level that is sufficient to fully turn on a cascade transistor to fully activate a corresponding amplifier branch, and has a low voltage level to fully turn off the cascade transistor to deactivate the corresponding amplifier branch. In this manner, PC2 activates (or deactivates) any number of amplifier branch pairs (each pair including phase 0 and 180 amplifier branch circuits) to determine the amount of amplification between AOUT and POUT.

Figure 4:
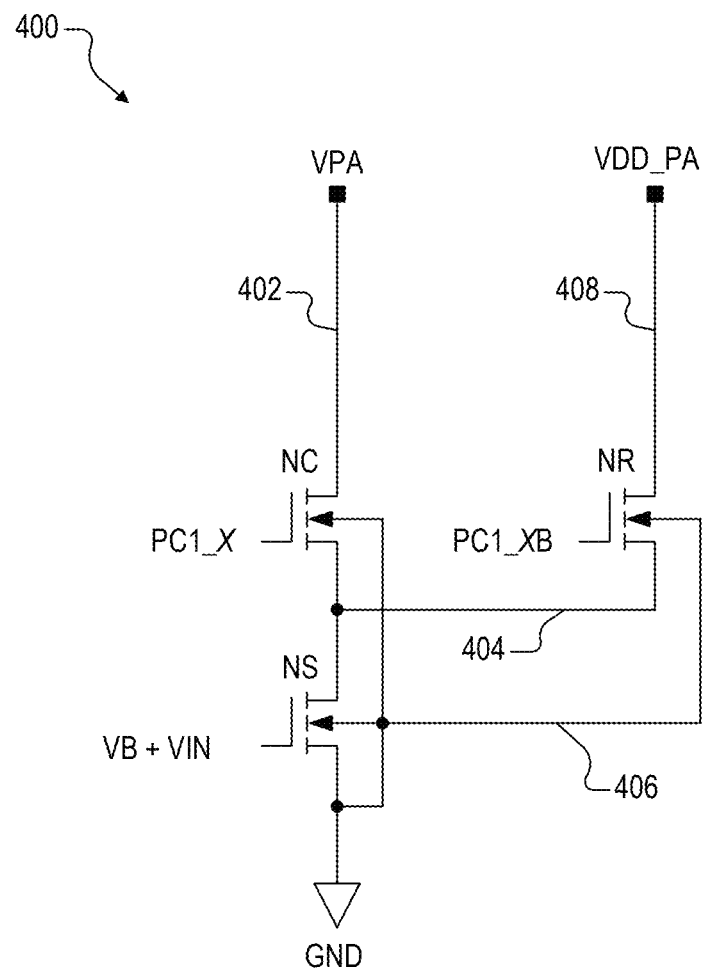
FIG. 4 is a schematic diagram of an amplifier branch that may be used for any one or more of the amplifier branch circuits PS00-PS0N or PS10-PS1N of the PA driver of FIG. 1 according to one embodiment of the present disclosure.

FIG. 4 is a schematic diagram of an amplifier branch circuit 400 that may be used for any one or more of the amplifier branch circuits PS00-PS0N or PS10-PS1N of the PA driver stage 106 according to one embodiment of the present disclosure. A signal VPA represents the output polarity, such as VPA_IN0 or VPA_IN180 depending upon which amplifier branch is implemented. PC1_X and PC1_XB collectively represent the complementary activation signal pair of the applicable amplifier branch circuit, such as PC1_0 and PC1_0B, or PC1_1 and PC1_1B, etc. VIN represents either VIN_0 for phase 0, or VIN_180 for phase 180. The amplifier branch circuit 400 may also be used for any one or more of the amplifier branch circuits of the PA output stage 108 in similar manner, in which the corresponding signal names are changed accordingly.

The amplifier branch circuit 400 includes NMOS transistor devices NC, NS, and NR, in which each transistor may be configured as a metal-oxide semiconductor, field-effect transistor (MOSFET) or an N-channel FET (NFET) or the like. Although not specifically shown, similar configurations are also contemplated for other types of devices, such as bipolar junction transistors (BJTs), P-type or P-channel transistors, among other types of transistors or devices. Each of the devices has a pair current terminals, such as source and drain terminals or collector and emitter terminals or the like, and a control terminal, such as a gate terminal or a base terminal or the like. NC is a cascode transistor coupled in a cascode configuration with NS, NS is a source transistor for converting an input signal, and NR is a replica cascode transistor that is a replica of NC. Since NR is essentially coupled in parallel with NC, NR may also be considered to be coupled in a cascode configuration with NS. NC has a drain terminal coupled to an output node 402, a source terminal coupled to an intermediate node 404, a gate terminal receiving PC1_X, and a body connection coupled to a node 406. Node 402 is coupled to VPA (the respective output polarity signal of a given phase), and node 406 is coupled to GND. NS has a drain terminal coupled to node 404, a source terminal and a body connection both coupled to node 406, and a gate terminal receiving VB+VIN. NR has a drain terminal coupled to a node 408, a source terminal coupled to node 404, a gate terminal receiving PC1_XB, and a body connection coupled to node 406. Node 408 is coupled to the supply voltage VDD_PA.

In operation of the amplifier branch circuit 400, only one of NC and NR are turned on at a time to activate or deactivate the amplifier branch circuit 400. When PC1_X is asserted high to activate the amplifier branch circuit 400, then the input signal VB+VIN applied to the source transistor NS is effectively amplified to contribute to the generation of the output polarity signal VPA. Also, when PC1_X is asserted high, PC1_XB is asserted low turning off NR so that it does not have an effect on the operation of the amplifier branch circuit 400 or the overall power amplifier. When PC1_X is asserted low to deactivate the amplifier branch circuit 400, NC is turned off so that the input signal VB+VIN is generally removed from the amplification output path. Also, when PC1_X is asserted low, PC1_XB is asserted high turning on NR. In this manner, current that would otherwise flow through NC instead flows through NR. Since NR is referenced to VDD_PA rather than VPA, the amplifier branch circuit 400 does not contribute to the generation of the output polarity signal VPA when NR is turned on while NC is turned off.

NC is a low voltage device and VPA has a relatively high voltage level, such as a voltage level that is greater than the voltage rating of NC. When NC is turned off to deactivate the amplifier branch in a conventional configuration in which NR is not provided, since there is otherwise no current flow, the voltage level of VPA is effectively placed across NC violating its voltage rating. In this manner, NC is temporarily stressed and would otherwise remain stressed for as long as power is applied and NC is turned off. NC might or might not immediately fail, but multiple cycles of operation with corresponding stresses significantly reduces the reliability of NC causing it to fail much sooner than if not placed in voltage stressed situations. Since the amplifier branch circuit 400 is only one of many amplifier branch circuits coupled in parallel for either one or both of the power amplifier stages of the transmission chain 100, including the PA driver stage 106 and the PA output stage 108, such repetitive or otherwise continuous voltage stress otherwise results in a substantial reduction of reliability of the overall radar system.

In contrast, when NR is provided, NR is turned on to maintain current flow when NC is turned off. In this manner, the voltage level of the intermediate node 404 is increased relative to the conventional configuration such that the maximum voltage rating of NC is not exceeded so that it is no longer stressed when the amplifier branch circuit 400 is turned off. In other words, the voltage placed across NC when the amplifier branch circuit 400 is turned off is significantly less than VPA and within the maximum voltage rating of NC. In this manner, NC is not stressed and the reliability issue is avoided.

It is further noted that as the output power controller 112 toggles the PC1 and PC2 signals at a high rate to quickly adjust power level, since current is simply switched between the cascode transistor and the replica cascode transistor in each amplifier branch, the overall current level remains relatively constant. In addition, the overall rate of current change supplied by VDD_PA over time, or di/dt, during switching is substantially reduced.

In a more specific configuration, VDD_PA has a voltage level of at least 1.4 Volts (V) relative to GND (at 0V), so that VPA may also be about 1.4V. In addition, the maximum voltage rating of NC and NR is about 0.9V. VPA and each of the PC1 and PC2 activation signals may be as high as VDD_PA, or about 1.4V. Thus, when PC1_X is low turning off NC while NR is not present, then NC, with a maximum voltage rating of 0.9V, would otherwise be exposed to a high voltage of 1.4V causing significant stress substantially reducing reliability. When NR is present, however, PC1_XB is asserted high (when PC1_X is low) turning on NR to reduce the voltage applied to NC while turned off. In addition, to avoiding stress being applied to NC and NR, PC1_X and PC1_XB (and each of the PC2 signals as well) have low voltage levels that are greater than 0V. In this specific configuration with VDD_PA at 1.4V and a voltage rating of 0.9V, then PC1_X and PC1_XB (including all of the PC1 and PC2 signals) each have a low voltage level of about VDD_PA-0.9V, or about 0.5V. These specific voltage levels are exemplary only and may be different for different embodiments and configurations.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A power amplifier stage, comprising:
   a plurality of amplifier branch circuits, each amplifier branch circuit comprising:
      a first cascode device having current terminals coupled between an output node and an intermediate node, and having a control terminal receiving a corresponding one of a plurality of first activation signals;
      a source cascode device having current terminals coupled between a supply reference node and the intermediate node, and having a control terminal receiving an input signal; and
      a replica cascode device having current terminals coupled between a power supply node and the intermediate node, and having a control terminal receiving a corresponding one of a plurality of complementary activation signals; and
   wherein an output power level of the power amplifier stage is controlled by asserting a selected number of the plurality of first activation signals and corresponding ones of the plurality of complementary activation signals for activating a selected number of the plurality of amplifier branch circuits;
   wherein deactivation of the replica cascode device and activation of the first cascode device provides a power gain to the input signal at the output node; and
   wherein activation of the replica cascode device and deactivation of the first cascode device results in no power gain at the output node with respect to the input signal.

2. The power amplifier stage of claim 1, wherein the plurality of amplifier branch circuits comprises a first plurality of amplifier branch circuits of a first phase each having a source device with a control terminal receiving a first phase input signal, and comprises a second plurality of amplifier branch circuits of a second phase each having a source device with a control terminal receiving a second phase input signal.

3. The power amplifier stage of claim 1, wherein the plurality of first activation signals and the plurality of complementary activation signals each have a high state and a low state, and wherein each of the plurality of complementary activation signals is asserted to an opposite state as a corresponding one of the plurality of first activation signals.

4. The power amplifier stage of claim 1, wherein the first cascode device is turned on by a corresponding one of the plurality of first activation signals while the replica cascode device is turned off by a corresponding one of the plurality of complementary activation signals to activate a corresponding one of the plurality of amplifier branch circuits.

5. The power amplifier stage of claim 1, wherein the first cascode device is turned off by a corresponding one of the plurality of first activation signals while the replica cascode device is turned on by a corresponding one of the plurality of complementary activation signals to deactivate a corresponding one of the plurality of amplifier branch circuits.

6. The power amplifier stage of claim 1, wherein the output node has a high voltage level that is greater than a maximum voltage rating of the first cascode device, and wherein each of the plurality of first activation signals has a low state having a low voltage level that is sufficiently low to turn off the first cascode device while being sufficiently high so that the maximum voltage rating of the first cascode device is not exceeded.

7. The power amplifier stage of claim 6, wherein the low voltage level is approximately equal to the high voltage level minus the maximum voltage rating of the first cascode device.

8. The power amplifier stage of claim 1, wherein the first cascode device, the source device, and the replica cascode device each comprise an NMOS transistor.

9. The power amplifier stage of claim 1, wherein the first cascode device, the source device, and the replica cascode device each comprise an NMOS transistor having a body connection coupled to the supply reference node.

10. A power amplifier stage, comprising:
    a plurality of amplifier branch circuits, each amplifier branch circuit comprising:
       a corresponding one of a plurality of first cascode transistors having current terminals coupled between an output node and a corresponding one of a plurality of intermediate nodes, and having a control terminal receiving a corresponding one of a plurality of first activation signals;
       a corresponding one of a plurality of source transistors having current terminals coupled between a supply reference node and a corresponding one of the plurality of intermediate nodes, and having a control terminal receiving an input signal; and
       a corresponding one of a plurality of replica cascode transistors having current terminals coupled between a power supply node and the corresponding one of the plurality of intermediate nodes, and having a control terminal receiving a corresponding one of a plurality of complementary activation signals; and
    wherein a power output level of the power amplifier stage is controlled by asserting a selected number of the plurality of first activation signals and corresponding ones of the plurality of complementary activation signals for activating a selected number of the plurality of amplifier branch circuits; and wherein:
activation of the plurality of first cascode transistors and deactivation of the plurality of replica cascode transistors produces an amplified input signal at the output node; and
activation of the plurality of replica cascode transistors and deactivation of the plurality of first cascode transistors produces no power gain at the output node with respect to the input signal.

11. The power amplifier stage of claim 10, wherein:
the plurality of first cascode transistors comprises a first plurality of first cascode transistors of a first phase each having current terminals coupled between a first phase output node and a corresponding one of a first plurality of intermediate nodes of the first phase, and comprises a second plurality of first cascode transistors of a second phase each having current terminals coupled between a second phase output node and a corresponding one of a second plurality of intermediate nodes of the second phase;
wherein the plurality of source transistors comprises a first plurality of source transistors of the first phase each having current terminals coupled between the supply reference node and the corresponding one of a first plurality of intermediate nodes of the first phase and each having a control terminal receiving a first phase input signal, and comprises a second plurality of source transistors of the second phase each having current terminals coupled between the supply reference node and the corresponding one of a second plurality of intermediate nodes of the second phase and each having a control terminal receiving an input signal of the second phase; and
wherein the plurality of replica cascode transistors comprises a first plurality of replica cascode transistors of the first phase each having current terminals coupled between the power supply node and the corresponding one of the first plurality of intermediate nodes of the first phase, and comprises a second plurality of replica cascode transistors of the second phase each having current terminals coupled between the power supply node and the corresponding one of the second plurality of intermediate nodes of the second phase.

12. The power amplifier stage of claim 10, wherein the plurality of first activation signals and the plurality of complementary activation signals each have a high state and a low state, and wherein each of the plurality of complementary activation signals is asserted to an opposite state as a corresponding one of the plurality of first activation signals.

13. The power amplifier stage of claim 10, wherein each of the plurality of first cascode transistors that is turned on by a corresponding one of the plurality of first activation signals activates a corresponding one of the plurality of amplifier branch circuits, and wherein each of the plurality of replica cascode transistors of each of the activated amplifier branch circuits is turned off by a corresponding one of the plurality of complementary activation signals.

14. The power amplifier stage of claim 10, wherein each of the plurality of first cascode transistors that is turned off by a corresponding one of the plurality of first activation signals deactivates a corresponding one of the plurality of amplifier branch circuits, and wherein each of the plurality of replica cascode transistors of each of the deactivated amplifier branch circuits is turned on by a corresponding one of the plurality of complementary activation signals.

15. The power amplifier stage of claim 10, wherein the output node has a high voltage level that is greater than a maximum voltage rating of each of the plurality of first cascode transistors, and wherein each of the plurality of first activation signals has a low state having a low voltage level that is sufficiently low to turn off a corresponding first cascode transistor while sufficiently high so that the maximum voltage rating of the corresponding first cascode transistor is not exceeded.

16. The power amplifier stage of claim 15, wherein the low voltage level is approximately equal to the high voltage level minus the maximum voltage rating of each of the plurality of first cascode transistors.

17. The power amplifier stage of claim 10, wherein each of the plurality first cascode transistors, each of the plurality source transistors, and each of the plurality replica cascode transistors comprise an NMOS transistor having a body connection coupled to the supply reference node.

18. A transmitter chain of a radar system, comprising:
a power amplifier stage comprising a plurality of amplifier branch circuits, where each of the plurality of amplifier branch circuits comprises:
a first cascode device having current terminals coupled between an output node and an intermediate node, and having a control terminal receiving a corresponding one of a plurality of first activation signals;
a source device having current terminals coupled between a supply reference node and the intermediate node, and having a control terminal receiving an input signal; and
a replica cascode device having current terminals coupled between a power supply node and the intermediate node, and having a control terminal receiving a corresponding one of a plurality of complementary activation signals; and
an output power controller that asserts a selected number of the plurality of first activation signals and corresponding ones of the plurality of complementary activation signals for activating a selected number of the plurality of amplifier branch circuits;
wherein:
switching current between the first cascode device and the replica cascode device reduces current level changes and overall current from a power supply of the power amplifier stage and
deactivating the first cascode device and activating the replica cascode device results in no power gain for the input signal at the output node.

19. The transmitter chain of claim 18, wherein the plurality of first activation signals and the plurality of complementary activation signals each have opposite states comprising a high state and a low state, and wherein the output power controller asserts each of the plurality of first activation signals and each of corresponding ones of the plurality of complementary activation signals to opposite states.

20. The transmitter chain of claim 18, wherein the output node has a high voltage level that is greater than a maximum voltage rating of the first cascode device, and wherein each of the plurality of first activation signals has a low state having a low voltage level that is sufficiently low to turn off the first cascode device while being sufficiently high so that the maximum voltage rating of the first cascode device is not exceeded.

* * * * *